United States Patent [19]

Adell

[11] Patent Number: 4,682,415
[45] Date of Patent: Jul. 28, 1987

[54] METHOD OF MAKING PRINTED CIRCUITS

[75] Inventor: Robert Adell, Sunnyvale, Tex.

[73] Assignee: U.S. Product Development Company, Sunnyvale, Tex.

[21] Appl. No.: 791,841

[22] Filed: Oct. 28, 1985

[51] Int. Cl.⁴ ............................................. H05K 3/20
[52] U.S. Cl. ...................................... 29/846; 29/848; 156/233; 174/68.5
[58] Field of Search .......................... 29/846, 848, 849; 156/233; 174/68.5; 228/180.2

[56] References Cited

U.S. PATENT DOCUMENTS

| 2,969,300 | 1/1961 | Franz | 156/233 |
| 2,971,249 | 2/1961 | Anderson et al. | 174/68.5 |
| 3,080,270 | 3/1963 | Lorenz | 156/233 |
| 3,497,410 | 2/1970 | Zagusta et al. | 156/233 |
| 3,547,724 | 12/1970 | Zagusta | 156/233 |
| 4,316,320 | 2/1982 | Nogawa et al. | 228/180.2 X |
| 4,465,538 | 8/1984 | Schmoock | 29/846 X |

FOREIGN PATENT DOCUMENTS

| 858137 | 12/1970 | Canada | 29/848 |
| 2034527 | 6/1980 | United Kingdom | 29/837 |

Primary Examiner—Howard N. Goldberg
Assistant Examiner—Carl J. Arbes
Attorney, Agent, or Firm—Rhodes and Boller

[57] ABSTRACT

A method of making printed circuits which comprises passing a non-conductive strip of material past a device which repeatedly imparts a desired circuit pattern onto the passing strip so that a succession of identical printed circuit zones are created along the length of the strip. The strip is subsequently wound into a coil which can be stored for use as desired when printed circuit assemblies are to be fabricated. Fabrication of an assembly comprises unwinding the strip from the coil and severing of the strip between the individual printed circuit zones. A backing can be joined to the unwound strip before severing.

7 Claims, 4 Drawing Figures

METHOD OF MAKING PRINTED CIRCUITS

BACKGROUND AND SUMMARY OF THE INVENTION

This invention relates to a method for making printed circuits.

Printed circuits are frequently used in devices which contain electronic circuits. Individual electronic circuit devices, such as transistors, diodes, integrated circuits, etc., are mounted on such printed circuits to form printed circuit assemblies.

Various known processes exist for the fabrication of such printed circuit assemblies, and the present invention is directed to a new and improved method for making such printed circuit assemblies. Important advantages of the present invention are efficiencies in mass production coupled with reductions in inventory requirements.

In its basic aspect the present invention comprises the passing of a non-conductive strip of material past a device which repeatedly imparts a desired circuit pattern onto the passing strip so that a succession of identical printed circuit zones are created along the length of the strip. Afterwards, the strip is wound into a coil which can be stored for use as desired when printed circuit assemblies are to be fabricated. In this way the printed circuits can themselves be mass produced and efficiently stored for subsequent use when particular printed circuit assemblies are to be fabricated.

The foregoing features, advantages and benefits of the invention, along with additional ones, will be seen in the ensuing description and claims which should be considered in conjunction with the accompanying drawings. The drawings disclose a preferred embodiment of the invention according to the best mode contemplated at the present time in carrying out the invention.

DESCRIPTION OF THE PREFERRED EMBODIMENT

Figure 1:
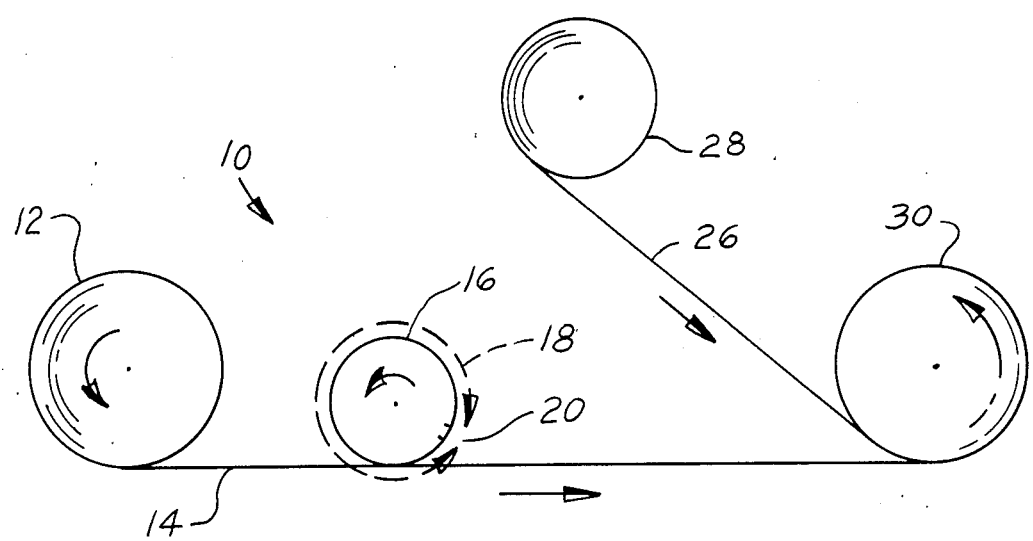
FIG. 1 is a side elevational view of apparatus practicing the method of the present invention.

FIG. 1 shows a semi-schematic representation of apparatus 10 practicing the preferred method of the present invention. The method starts with a coil 12 of non-conductive strip material 14. The strip 14 is uncoiled from coil 12 and passes into cooperative association with a wheel 16.

Wheel 16 imparts a given circuit pattern to strip 14 as the strip passes across the wheel 16 so that a succession of printed circuit zones 22 are imparted to successive portions of strip 14.

The illustrated embodiment of wheel 16 has a printing zone 18 extending around a substantial portion of its periphery, and zone 18 contains the given circuit pattern. There is a spacing 20 between the ends of this zone 18 so that the zone 18 is not continuous around the full extent of wheel 16.

Wheel 16 rotates in a synchronized manner with the speed of travel of strip 14 so that the tangent point of the wheel and the moving strip have the same velocity. In this way there is no slip between the wheel and the strip as the strip travels past the wheel. The wheel 16 may comprise any suitable means for imparting any suitable electrically conductive material to the strip 14. For example the wheel may comprise a means for imprinting electro-conductive inks onto the surface of the strip which is engaged by the wheel.

After having passed across the wheel 16 it can be seen that the strip has a succession of individual printed circuit zones 22 which are separate and discrete, being separated by zones 24 which consist only of non-conductive strip material 14. The given circuit pattern comprises a plurality of independent conductive paths 25.

The strip containing the imprint circuit zones thereon is then overlaid by a second strip 26 from a coil 28. The material of this second strip 26 is an electrical insulator. The overlying strips 14, 26 are then wound into a coil 30 at a coiling station so that the finished coil consists of convolutions of strip 14 in which the individual convolutions are separated by the material of strip 26.

After a certain accumulation of the wound strip forming the coil 30, the strip is severed and the completed coil 30 is bound to form a finished coil which is available for use in subsequent operations to be hereinafter described.

Figure 2:
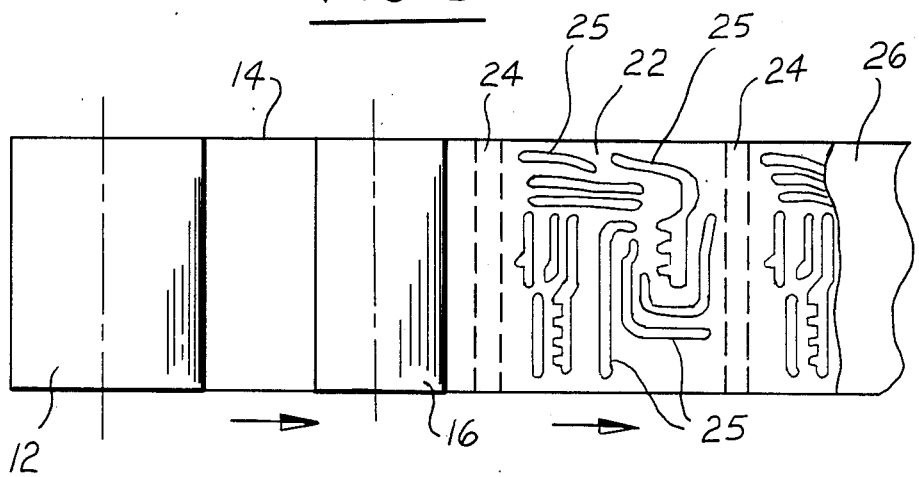
FIG. 2 is a top plan view of FIG. 1 with portions broken away.

The process depicted by FIGS. 1 and 2 may be run continuously by providing plural coil handling means at 12, 28 and 30. For example, once one coil 30 has been completed, the strip is immediately coiled on a new coiling apparatus to begin a new coil. In the case of 12 and 28, when the end of a coil is reached, the beginning of a new coil is immediately attached to the trailing end of the expended coil. Alternatively, it would be possible to stop the line to attend to coil changing operations but this would mean that the line would not be quite as efficient due to downtime for coil change.

Figure 3:
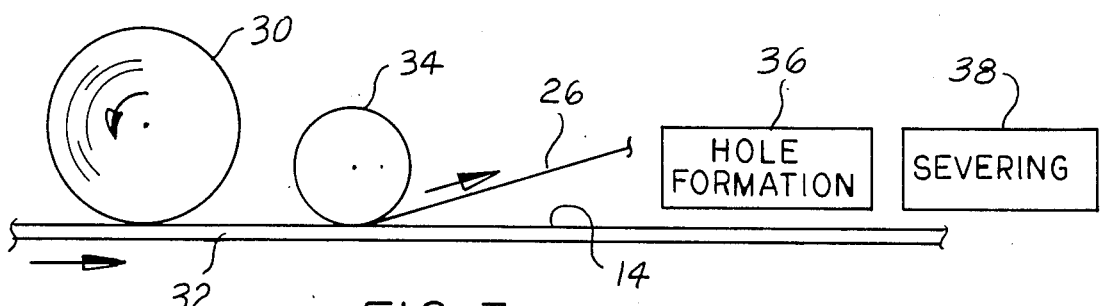
FIG. 3 is a side elevational view of apparatus practicing further steps in the method of the present invention.

FIG. 3 shows a further aspect of the method utilizing a completed coil 30. The coil 30 is suitably supported at an uncoiling station and unwound. The unwound strip 14 is shown being assembled to a more rigid backing 32. The backing 32 may be fed at the same velocity as the strip 14 is being unwound from coil 30. The strip 26 remains over strip 14 as strip 14 is joined to the backing 32. Any suitable means of joining the two parts 14 and 32 may be utilized. In this way a succession of individual circuit boards composed of the strip 14 assembled onto the strip 32 are formed.

The reference numeral 34 illustrates the application of pressure to the strip as part of the joining process (by a wheel for example); after this point strip 26 can be removed. Thus the strip 26 provides an engagement surface by the member 34 so that the member 34 does not directly contact the printed circuit strip 14. The two parts 32 and 14 may form an integral laminated construction, by way of example.

Where a printed circuit assembly is to be used in association with individual electronic devices such as those mentioned above, it is necessary to create a hole pattern in the printed circuit assembly in accordance with a predetermined pattern. Any suitable means 36 for creating this hole pattern may be used, for example, mechanical punching, laser drilling, etc.

After the hole pattern has been created in a printed circuit assembly, the individual assembly is removed from the strip by severing 38 across the non-conductive zone 24.

The printed circuit boards are now available for subsequent operations such as assembly of the individual electronic components thereto.

Figure 4:
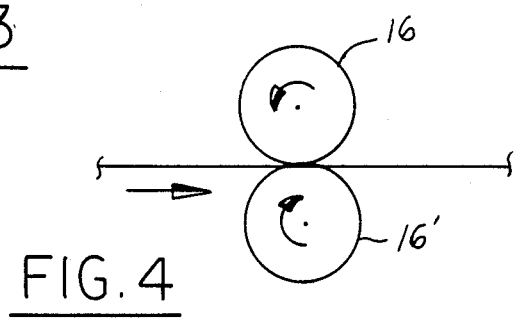
FIG. 4 is a fragmentary side elevational view illustrating a modification of a portion of FIG. 1.

FIG. 4 illustrates a modified form wherein circuit patterns are imparted to both sides of the strip by opposed wheels 16, 16'.

A particular advantage of the invention is that it enables a supply of printed circuits to be ready in a coiled form for subsequent use whenever needed. Thus it is unnecessary to stock and inventory a large supply of individual circuit board assemblies. The individual circuits are removed from the individual coils as needed.

Changing of the printed circuit design can be accomplished by changing the individual wheel, or wheels, which imparts the circuit pattern. Thus the basic apparatus is adapted to produce virtually any printed circuit board pattern simply by changing one or more wheels. The invention is therefore highly versatile and useful.

The particular apparatus for practice of the method of the invention may comprise standard apparatus appropriately synchronized. Thus it is unnecessary to describe these in detail, since such coiling, uncoiling and synchronizing means are known.

While a preferred embodiment of the invention has been disclosed, it will be appreciated that principles are applicable to other embodiments.

What is claimed is:

1. A method of fabricating printed circuits comprising providing a conductive pattern producing means which can impart electrically conductive material in a given circuit pattern composed of a plurality of independent conductive paths, passing a strip of electrically nonconductive material in cooperative association with said means to cause said given pattern to be repeatedly imparted to separate successive zones of the strip thereby forming a succession of identical printed circuit zones separated from each other along said strip, and then coiling the strip to form a coiled supply of printed circuits for subsequent use as desired, and further including the steps of uncoiling the coiled strip and joining it to a more rigid backing, creating a desired hole pattern in each printed circuit passing through both the strip and the backing, and of severing the strip between successive zones to form separated individual printed circuits.

2. A method as set forth in claim 1 in which said means comprises means for imparting circuit patterns to opposite sides of the strip.

3. A method as set forth in claim 1 including the step of introducing a further strip in cooperative association with the first-mentioned strip before coiling so that said further strip separates individual convolutions of the first-mentioned strip from each other in the coil.

4. A method as set forth in claim 3 including the steps of uncoiling the two overlying strips from the coil and joining the first-mentioned strip to a backing while the further strip remains overlying the first-mentioned strip, and then removing the further strip from the first-mentioned strip after said joining.

5. A method as set forth in claim 1 in which said strip is pulled from a coil located forwardly of said means by a pulling force applied from a device in which the strip is coiled.

6. A method of fabricating printed circuits comprising providing a conductive pattern producing means which can impart electrically conductive material in a given circuit pattern composed of a plurality of independent conductive paths, passing a strip of electrically non-conductive material in cooperative association with said means to cause said given pattern to be repeatedly imparted to separate successive zones of the strip thereby forming a succession of identical printed circuit zones separated from each other along said strip, and then coiling the strip to form a coiled supply of printed circuits for subsequent use as desired, and in which said non-conductive material is plastic and said conductive material is an electroconductive ink.

7. A method of fabricating printed circuits comprising providing a conductive pattern producing means which can impart electrically conductive material in a given circuit pattern composed of a plurality of independent conductive paths, passing a strip of electrically non-conductive material in cooperative association with said means to cause said given pattern to be repeatedly imparted to separate successive zones of the strip thereby forming a succession of identical printed circuit zones separated from each other along said strip, and then coiling the strip to form a coiled supply of printed circuits for subsequent use as desired, and in which said means comprises a wheel which rotates in synchronism with the strip as the strip passes in cooperative association across the wheel.

* * * * *